(12) United States Patent
Tetelbaum

(10) Patent No.: US 6,507,937 B1
(45) Date of Patent: Jan. 14, 2003

(54) METHOD OF GLOBAL PLACEMENT OF CONTROL CELLS AND HARDMAC PINS IN A DATAPATH MACRO FOR AN INTEGRATED CIRCUIT DESIGN

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/885,596

(22) Filed: Jun. 19, 2001

(51) Int. Cl.[7] ............................................... G06F 9/45
(52) U.S. Cl. ............................................. 716/8; 716/9
(58) Field of Search ........................... 716/8, 9, 10, 13, 716/14, 17, 12, 18, 11; G06F 9/45

(56) References Cited

U.S. PATENT DOCUMENTS

| | | | |
|---|---|---|---|
| 5,267,176 A | * 11/1993 | Antreich et al. | 716/10 |
| 5,408,237 A | * 4/1995 | Patterson et al. | 342/354 |
| 5,637,849 A | * 6/1997 | Wang et al. | 235/454 |
| 6,064,807 A | * 5/2000 | Arai et al. | 250/491.1 |
| 6,378,114 B1 | * 4/2002 | Shenoy et al. | 716/7 |
| 2001/0047507 A1 | * 11/2001 | Pileggi et al. | 716/8 |
| 2002/0042904 A1 | * 4/2002 | Ito et al. | 716/8 |

* cited by examiner

Primary Examiner—Don Wong
Assistant Examiner—Trinh Vo Dinh
(74) Attorney, Agent, or Firm—Fitch, Even, Tabin & Flannery

(57) ABSTRACT

A method of control cell placement for an integrated circuit design includes the steps of receiving as input a datapath description including an initial set of coordinates for a plurality of control cells; ordering the plurality of control cells in a sequence (1, 2, 3, . . . , n) according to distance between each of the plurality of control cells and at least one fixed control cell in the plurality of control cells wherein n is the number of control cells in the datapath description; iteratively calculating globally optimum coordinates for the each of the plurality of control cells according to the sequence i=1, 2, 3, . . . , n from a global maximum of a control cell placement function; and generating as output the calculated globally optimum coordinates for the each of the plurality of control cells.

6 Claims, 11 Drawing Sheets

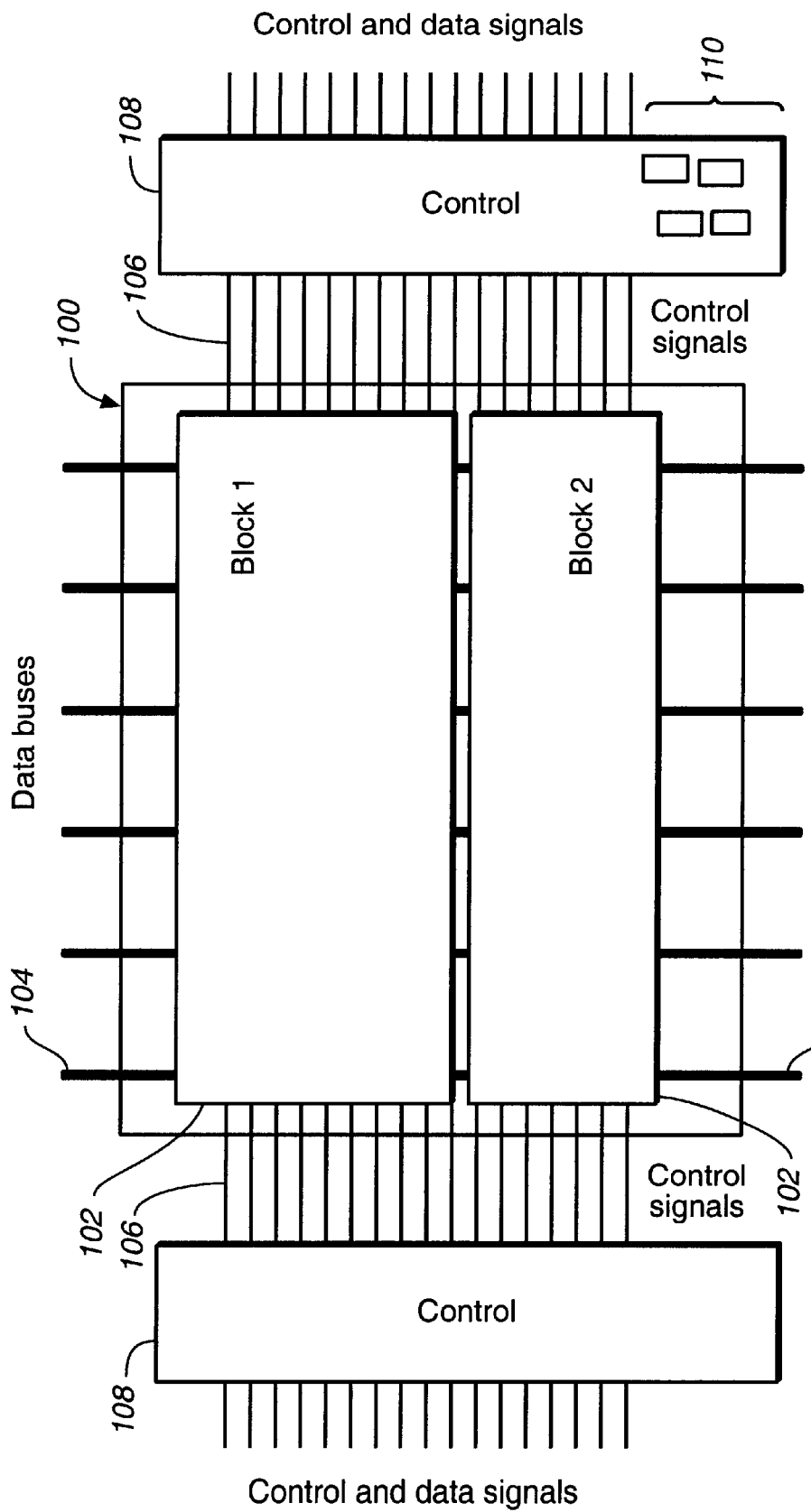
FIG._1

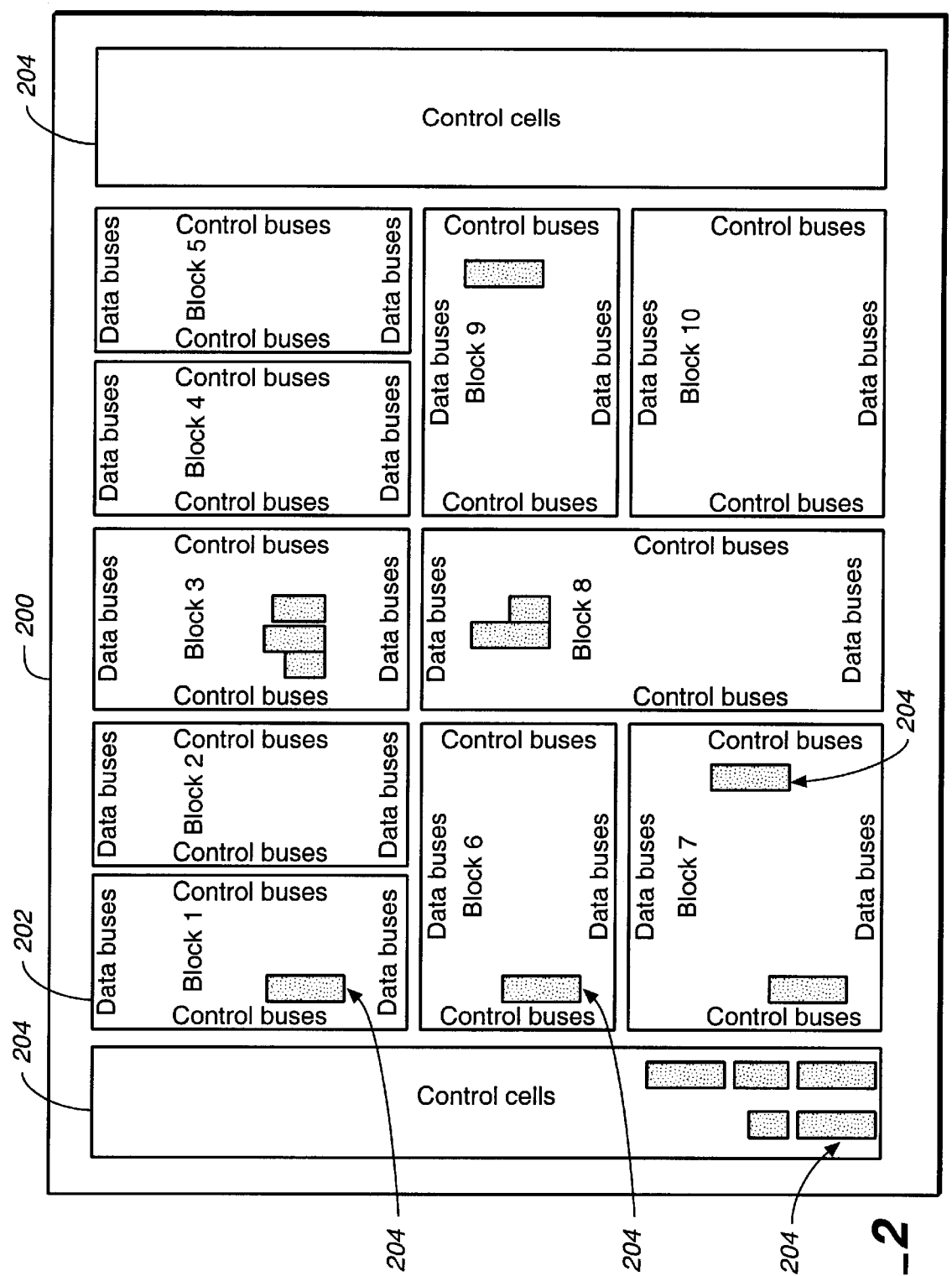
FIG._2

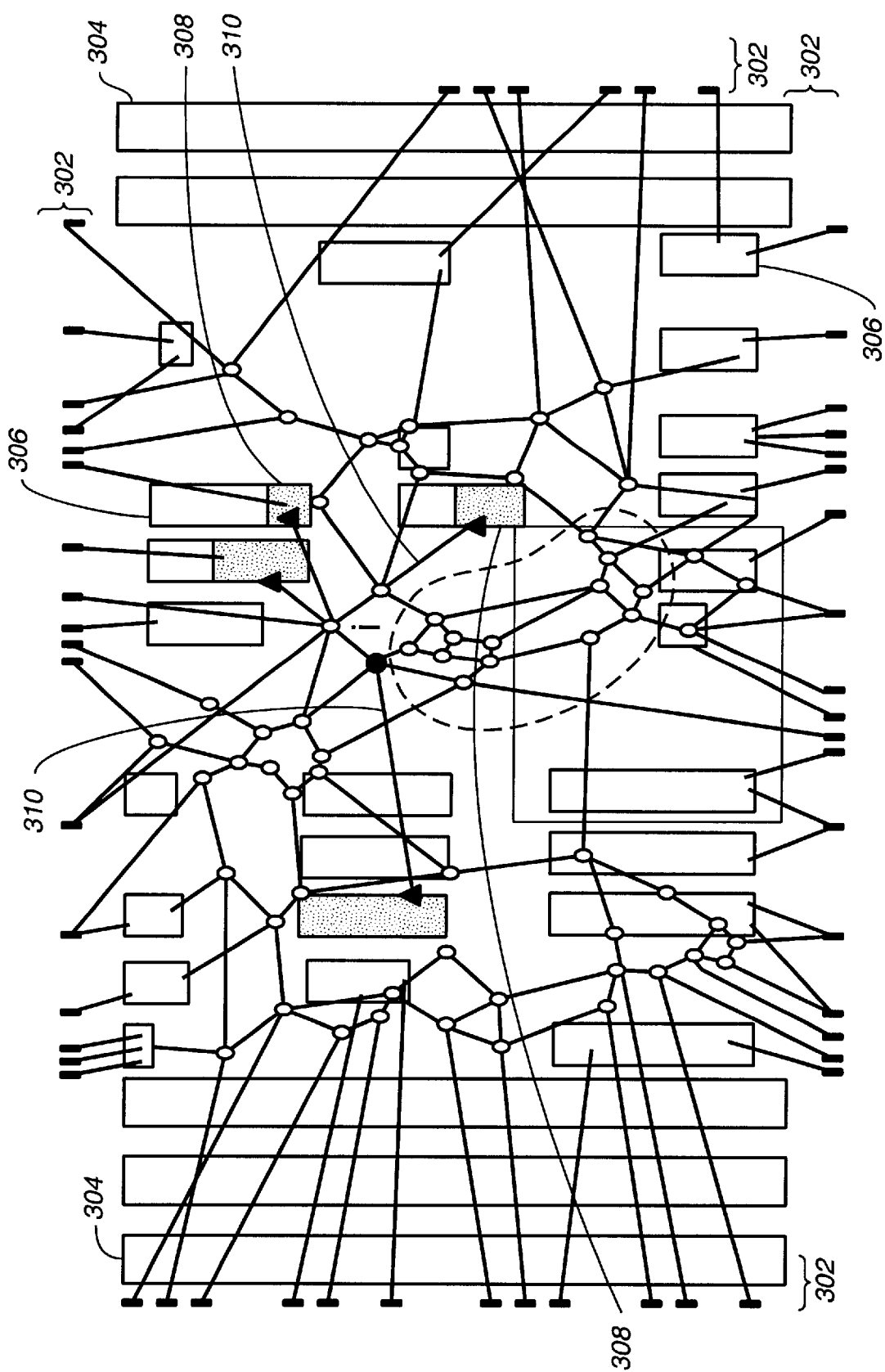
FIG._3

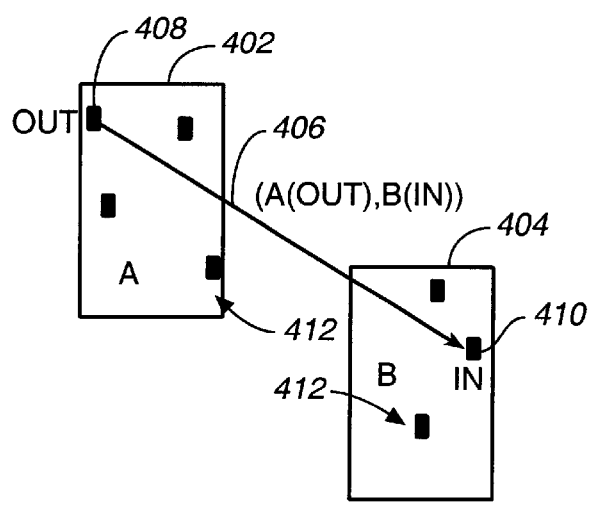
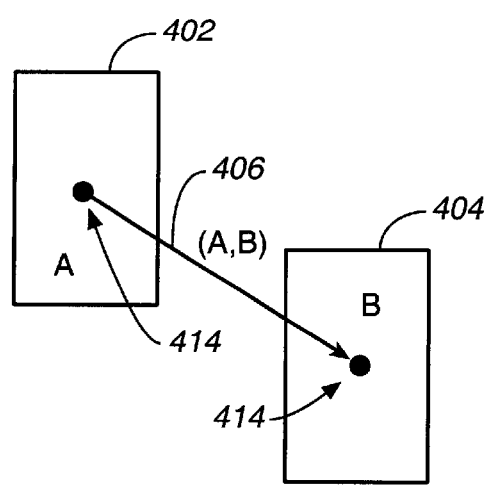
FIG._4A   FIG._4B

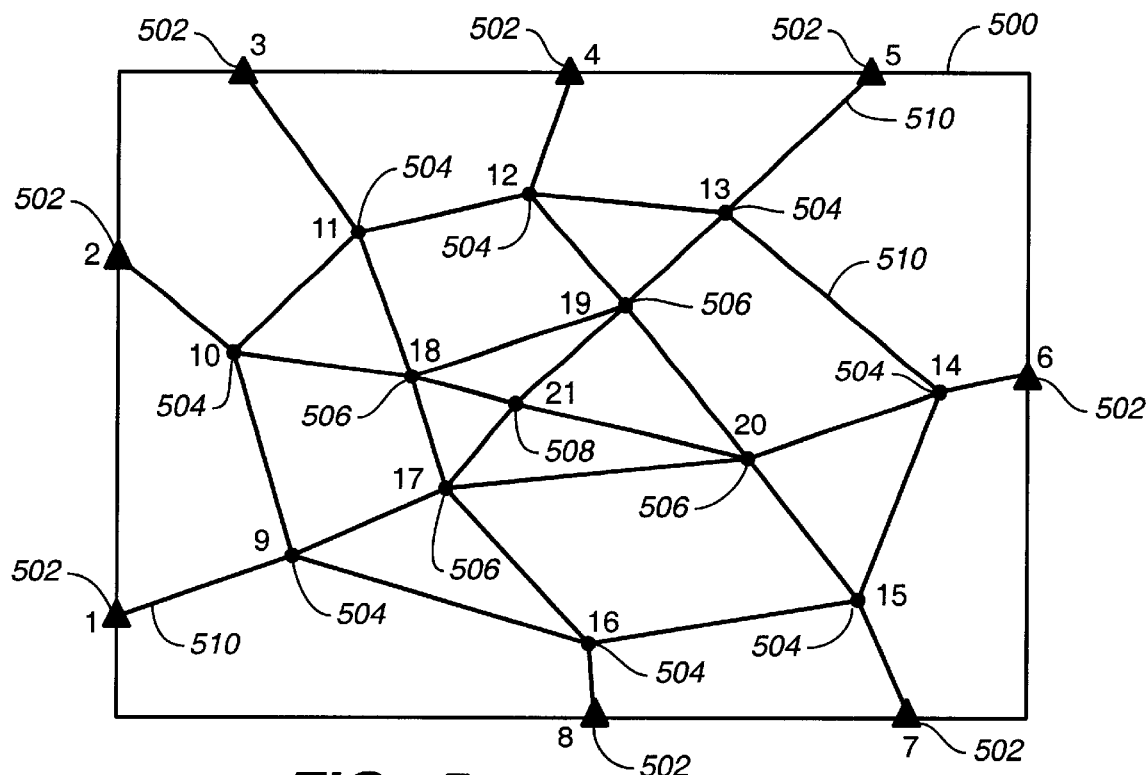
FIG._5
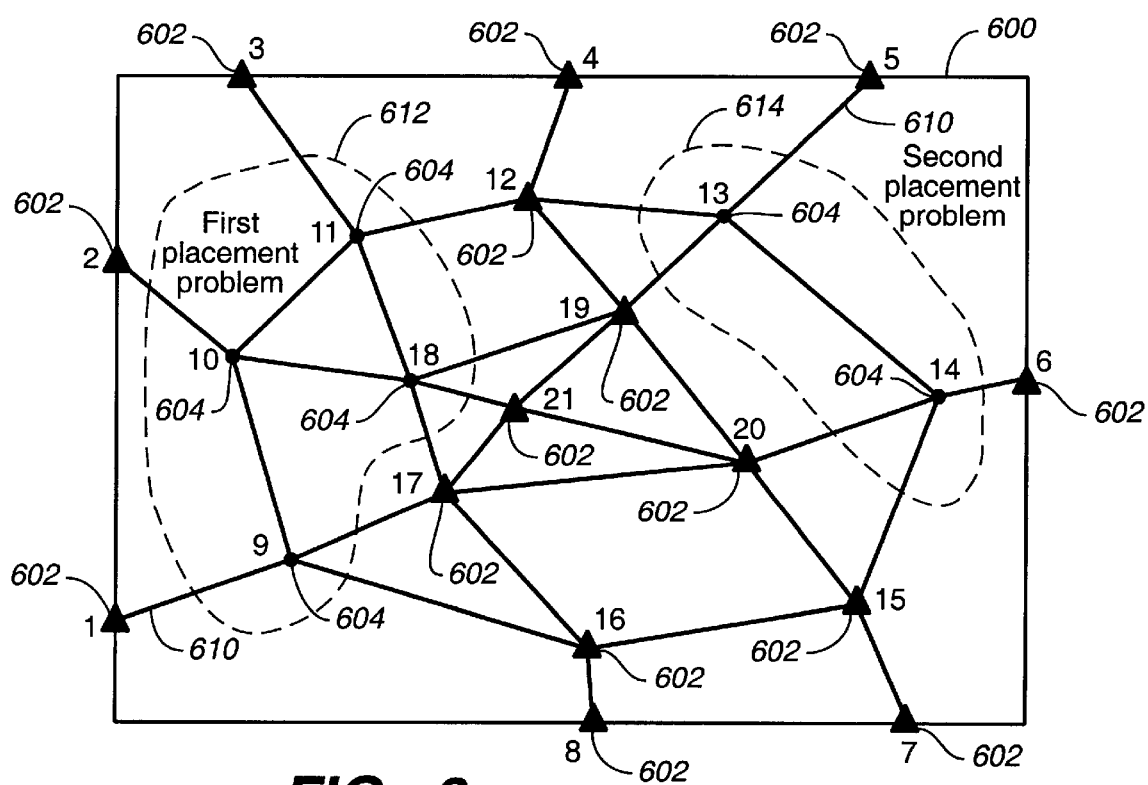
FIG._6

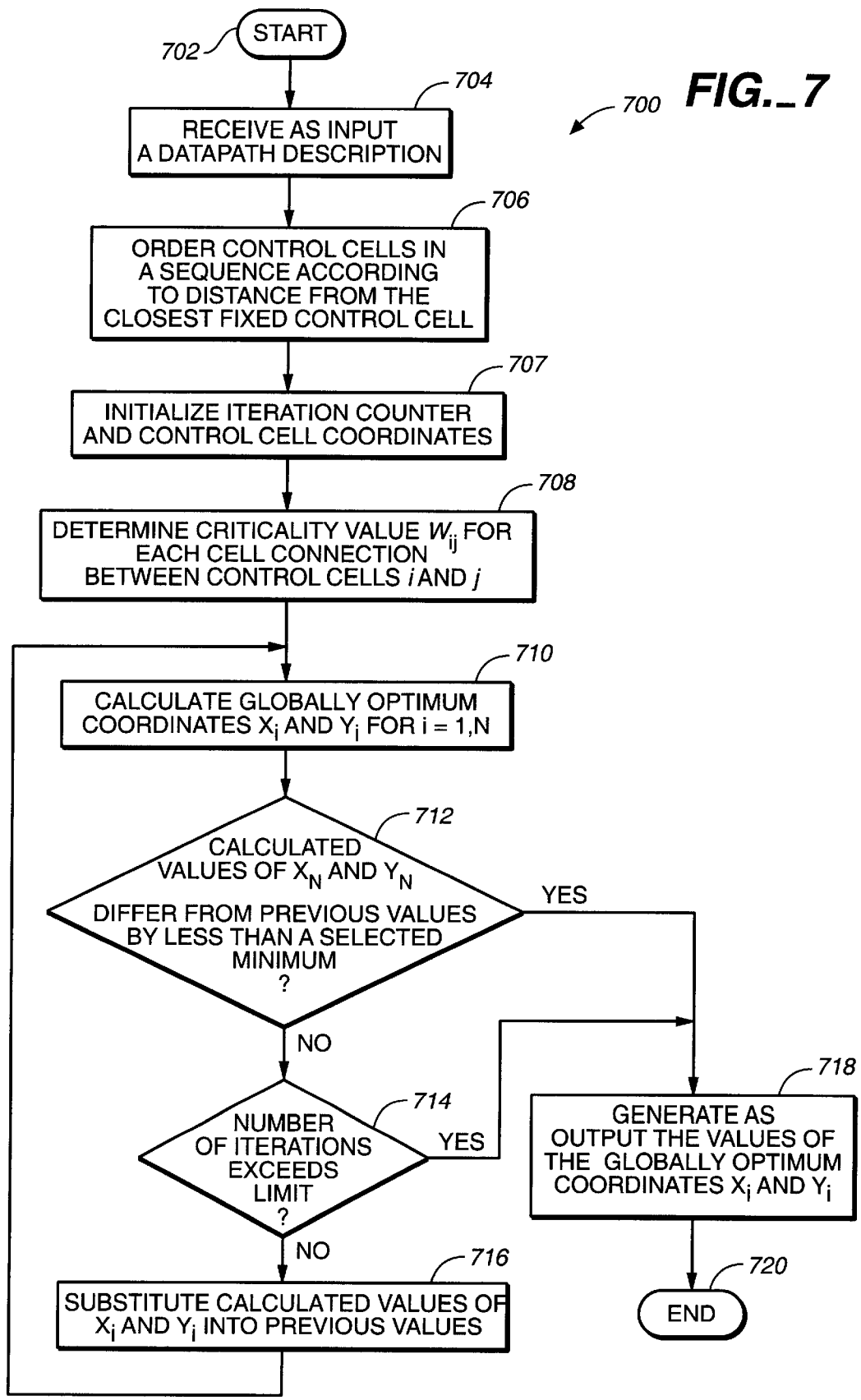
FIG._7

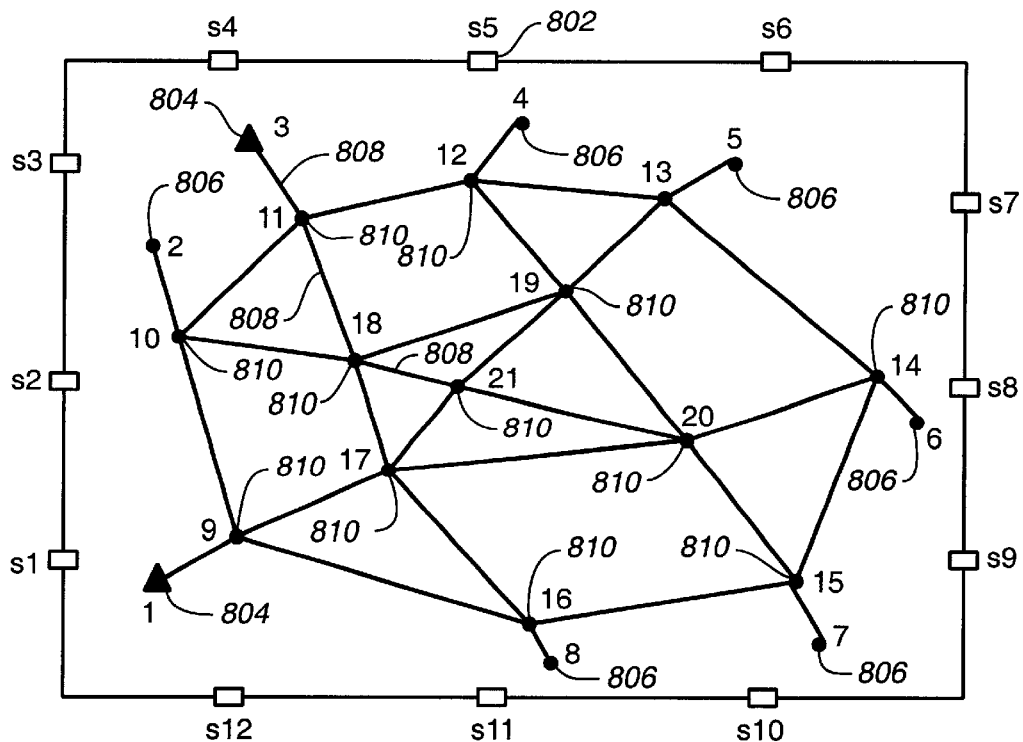
FIG._8
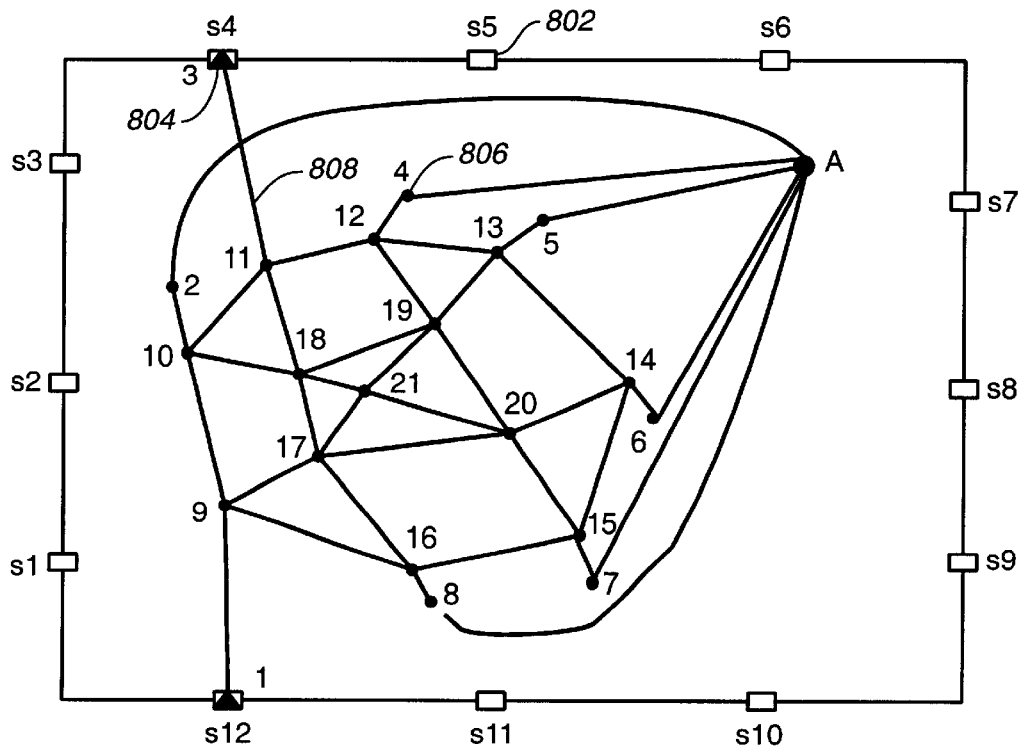
FIG._9

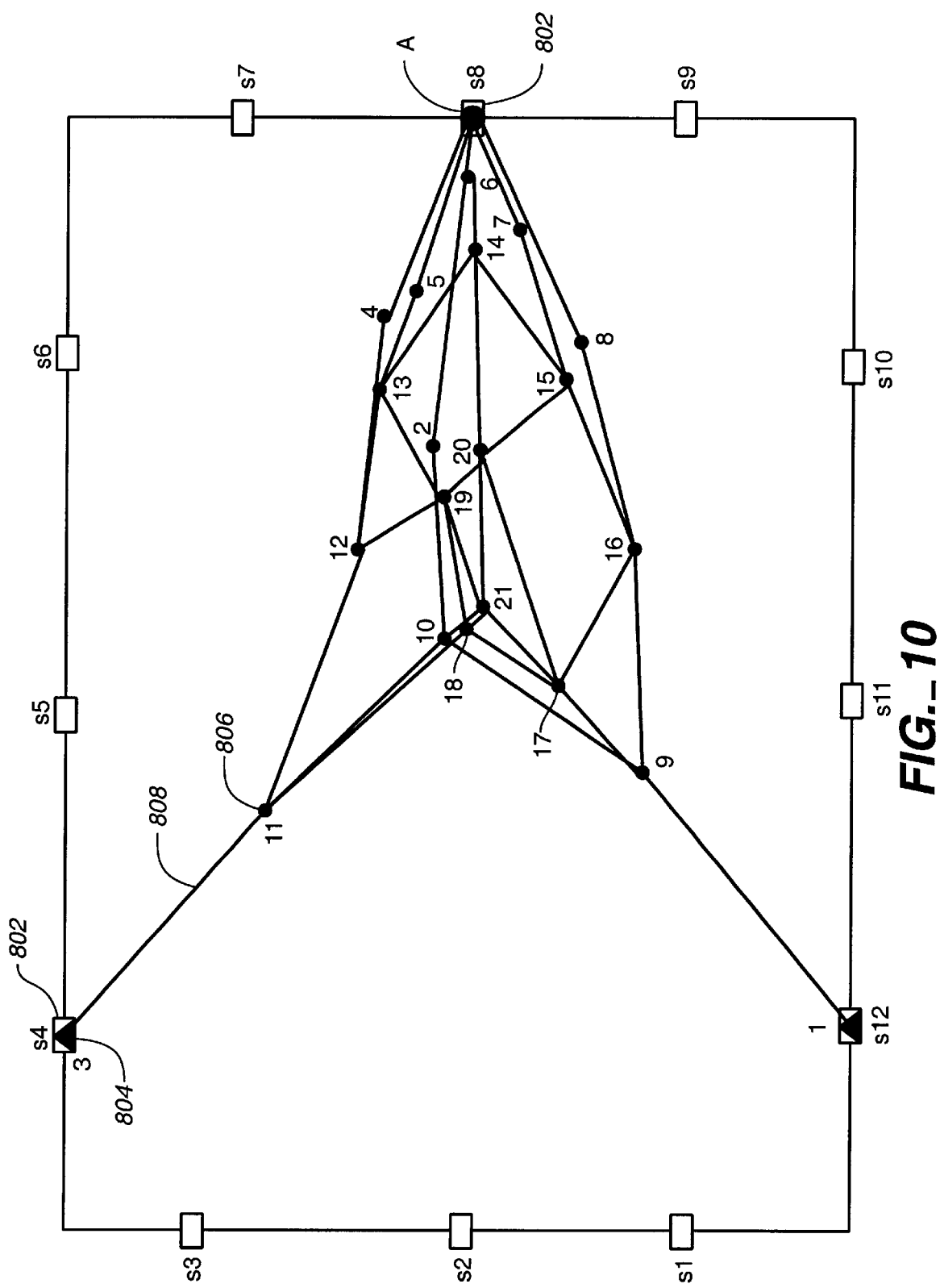
FIG._10

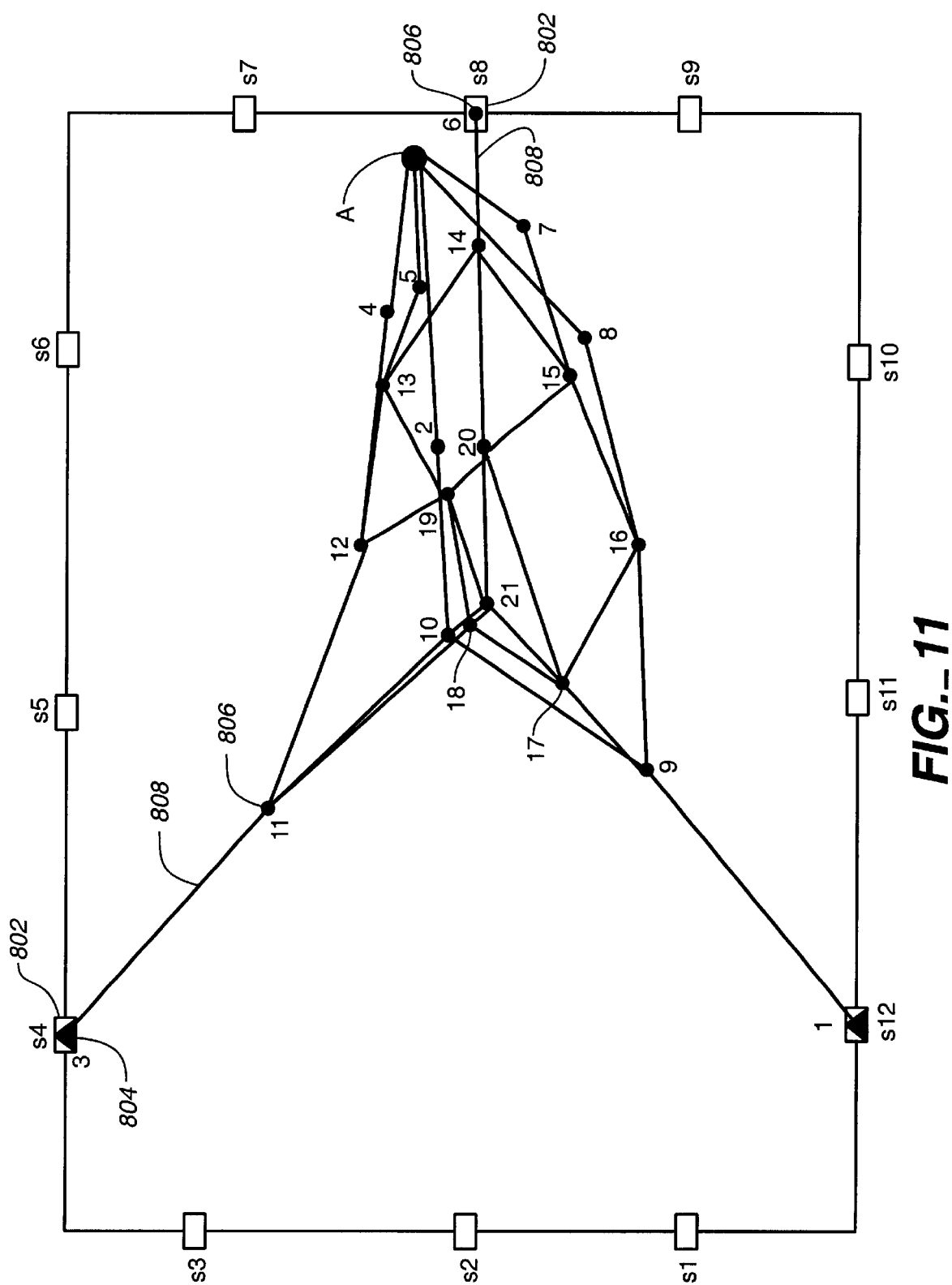
FIG._11

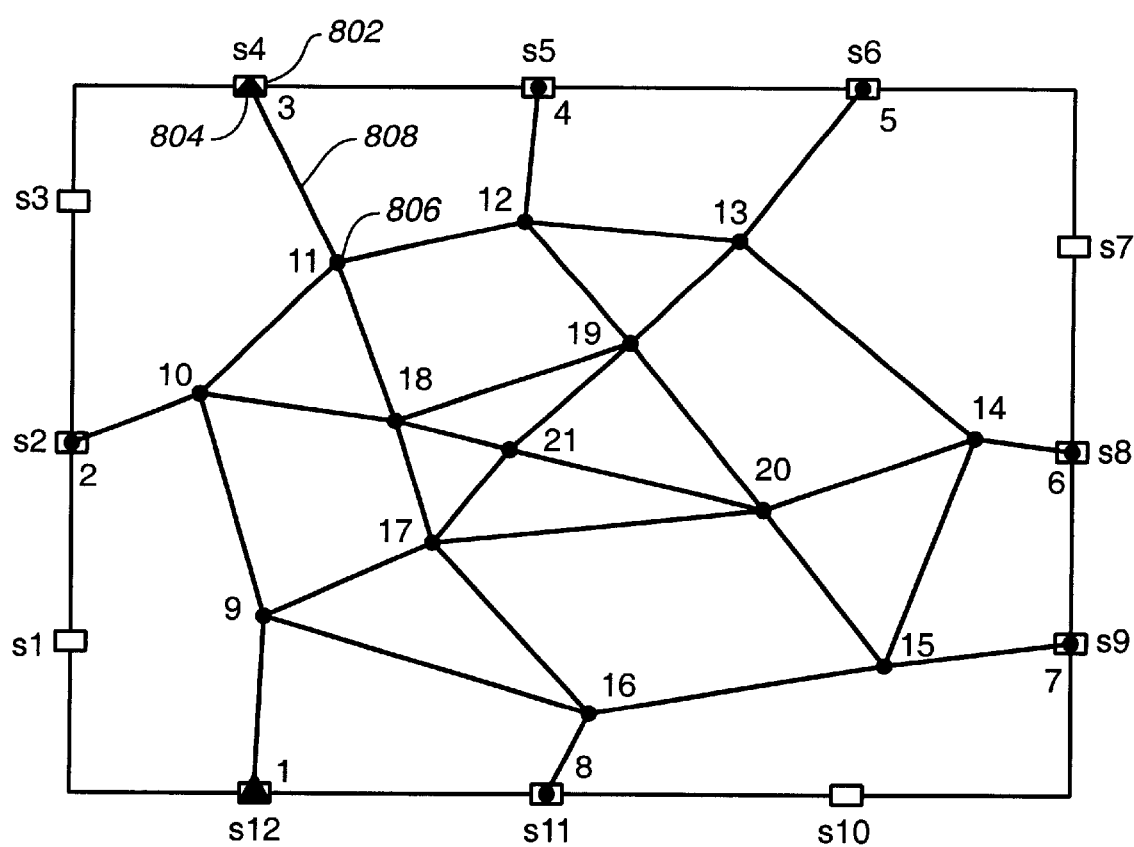
FIG._12

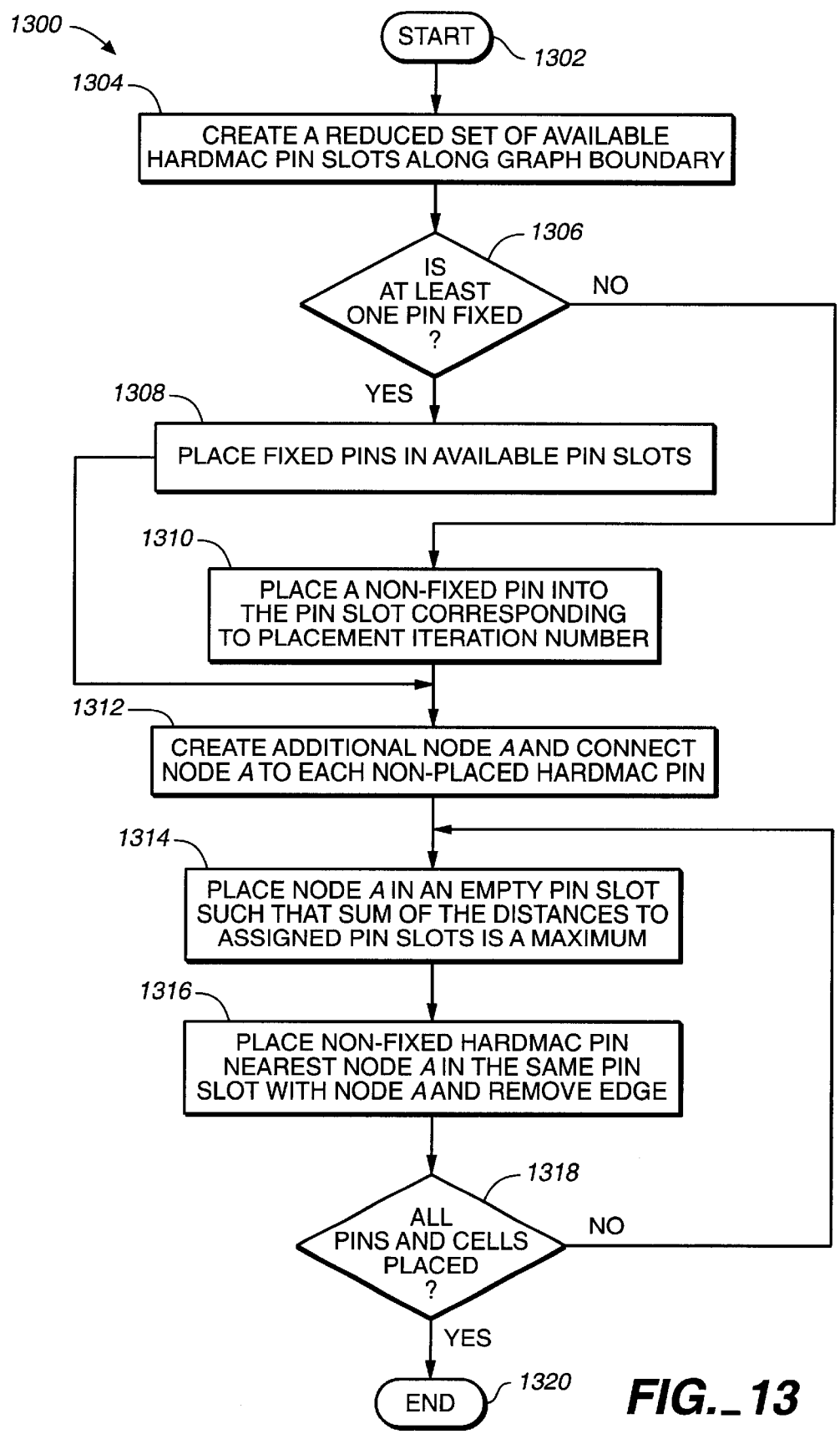
FIG._13

METHOD OF GLOBAL PLACEMENT OF CONTROL CELLS AND HARDMAC PINS IN A DATAPATH MACRO FOR AN INTEGRATED CIRCUIT DESIGN

BACKGROUND OF THE INVENTION

The present invention relates generally to design tools for integrated circuits. More specifically, but without limitation thereto, the present invention relates to a method of global placement of control cells and hardmac pins in a datapath macro to minimize signal propagation time and datapath macro area in an integrated circuit design.

Integrated circuits typically include datapath macros. A datapath macro is an arrangement of datapath blocks connected by data buses and control signals. The data buses are generally routed vertically, and the control signals are generally routed horizontally. The datapath macro contains a set of datapath blocks placed along the vertical direction. Each datapath block has a datapath structure in which most data buses and control buses are located orthogonally with respect to each other and are connected to datapath cells in the datapath structure. Each of the datapath cells is connected to one or more of the data buses and to one or more of the control signals. As the size and complexity of the datapath macros and constituent datapath blocks increases, it becomes increasingly difficult for cell placement tools to arrange the datapath cells so that the signal propagation time through the datapath macro and the area of the datapath macro are minimized for datapath macro designs that include complex hierarchical structures, complex input constraints imposed on the placement of cells, pins, nets, gaps between cells, and so on. As the size and complexity of the datapath macros and constituent datapath blocks increases, therefore, signal propagation time through the datapath macro and the area of the datapath macro may be not be optimally minimized using conventional place and route methods.

SUMMARY OF THE INVENTION

The present invention advantageously addresses the problems above as well as other problems by providing a method of globally placing control cells and hardmac pins in a datapath macro design that advantageously accommodates datapath structures having a large number of datapath and control cells, produces a globally ideal control cell placement in terms of connectivity length and interconnection delays, includes internal cell pins, and has an almost linear time cost function.

In one embodiment, the present invention may be characterized as a method of globally placing control cells and hardmac pins for an integrated circuit design that includes the steps of receiving as input a datapath description including an initial set of coordinates for a plurality of control cells; ordering the plurality of control cells in a sequence (1, 2, 3, . . . , n) according to distance between each of the plurality of control cells and at least one fixed control cell in the plurality of control cells wherein n is the number of control cells in the datapath description; iteratively calculating globally optimum coordinates for the each of the plurality of control cells according to the sequence i=1, 2, 3, . . . , n from a global maximum of a control cell placement function; and generating as output the calculated globally optimum coordinates for the each of the plurality of control cells.

In another embodiment, the invention may be characterized as a computer program product that includes a medium for embodying a computer program for input to a computer and a computer program embodied in the medium for causing the computer to perform the following functions: receiving as input a datapath description including an initial set of coordinates for a plurality of control cells; ordering the plurality of control cells in a sequence (1, 2, 3, . . . , n) according to distance between each of the plurality of control cells and at least one fixed control cell in the plurality of control cells wherein n is the number of control cells in the datapath description; iteratively calculating globally optimum coordinates for the each of the plurality of control cells according to the sequence i=1, 2, 3, . . . , n from a global maximum of a control cell placement function; and generating as output the calculated globally optimum coordinates for the each of the plurality of control cells.

In a further embodiment, the invention may be characterized as a method of globally placing control cells and hardmac pins that generates a globally optimum placement of hardmac pins and control cells for hardmac designs in which at least one of the hardmac pins is non-fixed.

BRIEF DESCRIPTION OF THE DRAWINGS

The present invention is illustrated by way of example and not limitation in the accompanying figures, in which like references indicate similar elements, and wherein:

FIG. 1 is a diagram of a typical datapath macro structure of the prior art;

FIG. 2 is a diagram of a general datapath structure for illustrating an embodiment of the present invention;

FIG. 3 is a diagram illustrating a method of optimum control cell placement according to an embodiment of the present invention;

FIG. 4A is a diagram of an edge model for an actual datapath cell illustrating the method of FIG. 3;

FIG. 4B is a diagram of an edge model for a simplified datapath cell;

FIG. 5 is a diagram of a graph illustrating an example of numbering graph nodes according to a method of the present invention;

FIG. 6 is a diagram illustrating an example of partitioning a graph containing at least one fixed node according to a method of the present invention;

FIGS. 7A and 7B are a flowchart of a method of datapath cell placement according to an embodiment of the present invention;

FIG. 8 is a diagram of a graph representative of a hardmac illustrating an example of a reduced set of possible pin slots for placement of hardmac pins;

FIG. 9 is a diagram of a graph illustrating the addition of a node A connected to each of the non-fixed nodes in FIG. 8;

FIG. 10 is a diagram of a graph illustrating an optimum placement with the connection of a node A to an available pin slot in FIG. 8;

FIG. 11 is a diagram of a graph illustrating the placement of a non-fixed pin P closest to node A in FIG. 10;

FIG. 12 is a diagram of a graph illustrating the placement of all the non-fixed hardmac pins and control cells after placement of the first pin P in FIG. 11; and FIG. 13 is a flowchart of the method described with reference to FIGS. 8–12 for a hardmac design where some or none of the hardmac pins are fixed according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE EMBODIMENTS

FIG. 1 is a diagram of a typical datapath macro structure 100. Shown in FIG. 1 are data blocks 102, data buses 104, control signals 106, control blocks 108, and control cells 110. In this example, the datapath macro contains only two data blocks 102. The control blocks 108 contain the control cells 110. The data buses 104 are generally routed vertically through the data path macro 100, while the control signals 106 are generally routed horizontally. The data blocks 102 are arranged to include some or all of the data buses 102 and the control signals 104, depending on the functional requirements of each of the data blocks 102. The control blocks 108 are placed on each side of the datapath macro 100. Previous methods for placement of the control cells 110 are satisfactory for the simple layout of FIG. 1, but are not practical for complex structured datapaths having an arbitrary level of hierarchy and in which datapath blocks are arranged in clusters. In previous methods for placement of the control cells 110, only simple constraints are allowed on the placement of pins, cells, and nets, resulting in poor quality of datapath macro design.

In an arbitrary level of hierarchy, a datapath macro may itself be a datapath block in a datapath macro of a higher level of the hierarchy, and the datapath macro of the higher level of the hierarchy may itself be a datapath block in a datapath macro of a higher level of the hierarchy, and so on.

FIG. 2 is a diagram of a general datapath structure 200 for illustrating an embodiment of the present invention. Shown in FIG. 2 are datapath blocks 202 and control cells 204.

Each of the datapath blocks 202 contains vertically routed data buses and horizontally routed control buses. In the general datapath structure 200, the control cells 204 may be placed not only along the left and right sides of the datapath macro 100 as in the example of the control cells 110 in FIG. 1, but may also be distributed inside the datapath blocks 202. For example, the placement of some control cells, such as drivers and receivers, may be restricted to specific areas of a hardmac. The specific areas for placing these control cells are typically defined by gap cells. Also, any subset of hardmac pins, any subset of datapath cells, and any subset of control cells may be fixed at any location, and these subsets may change for different datapath cells having the same ideal placement function. The location of datapath cell pins within the datapath cells must be taken into consideration, because the size of the datapath cells may differ by a factor of hundreds.

The placement of control cells within the general datapath structure 200 cannot be solved by the placement of several groups of control cells 204 in different areas as with datapath cells. The problem of control cell placement is by nature a global placement problem, and any artificial clustering will negatively impact the quality of the design with respect to the placement of control cells 204.

FIG. 3 is a diagram illustrating a method of optimum control cell placement according to an embodiment of the present invention. Shown in FIG. 3 are placed hardmac pins 302, placement boxes 304, placed datapath cells 306, control cells 308, and control cell connections 310.

The placed hardmac pins 302 are predetermined bu user constraints. The placement boxes 304 define the areas where control cells may be placed. The placed datapath cells 306 have locations already selected by a place and route tool. An optimum placement is sought for the control cells 308 that minimizes interconnection length and delay for the control cell connections 310. A control cell placement is a globally optimum placement if a placement quality function representative of the total length of the control cell connections has a global minimum at the control cell coordinates without regard to legal locations of the control cells and the size of the control cells. Legal locations are locations in which a control cell does not overlap another cell, and in which all cell distance requirements of the technology are satisfied. Initially, the control cells are allowed to be placed anywhere in the hardmac without regard to their size. In the method of the present invention, the placement quality function describes a weighted sum of cell connection lengths as explained in greater detail below. The placement quality function, or criterion, is therefore ideal with respect to connectivity length. The ideal placement defined by the placement quality function guides the placement of datapath cells and hardmac pins, and may be further refined from time to time.

FIG. 4A is a diagram of an edge model for an actual datapath. Shown in FIG. 4A are cells 402 and 404, a cell connection 406, a cell output 408, a cell input 410, and cell pins 412.

The cell connection 406 connects the cell output 408 of the cell 402 to the cell input 410 of the cell 404. The cell connection 406 may expressed as an edge (A(OUT),B(IN)) of a graph. A weight may be assigned to the edge by a weighting function W(edge) having a value that is determined by the importance or criticality of the net containing the cell connection 406.

FIG. 4B is a diagram of an edge model for a simplified cell. Shown in FIG. 4B are cells 402 and 404, a cell connection 406, and cell centers 414. In this simplified edge model, pin locations inside the cells 402 and 404 are temporarily ignored, so that any edge (A(OUT),B(IN)) connects the centers of the cells 402 and 404. For a graph containing several cells and cell connections, the placement quality function F may be expressed by:

$$F = \sum_{e \in E} W_e L_e^2 \quad (1)$$

where $W_e$ is the weight of edge e, $L_e$ is the length of edge e, and E is the set of all edges in the graph, that is, the set of all connections in the datapath structure. By minimizing the function F, the minimum connection delays, which are proportional to the square of the connection lengths, and the minimum connection length are realized. Each cell corresponds to a node of the graph. If there are n nodes in the graph, the length $L_e$ of each edge e may be represented by the coordinates $X_i$ and $Y_j$ for each pair of nodes i and j at the ends of the edge e corresponding to the cells i and j at the ends of the cell connection, as follows:

$$F = \sum_{i=1}^{n} \sum_{j=1}^{n} W_{ij}[(X_i - X_j)^2 + (Y_i - Y_j)^2] \quad (2)$$

By differentiating F with respect to $X_i$ and $Y_i$ (i=1,2,3, ... n) and equating the derivative of F to zero, the following expressions may be obtained to iteratively calculate the ideal coordinates of the control cell $(X_i, Y_i)$:

$$X_i = \frac{\sum_{j \in A_i} W_{ij} X_j}{\sum_{j \in A_i} W_{ij}} \quad (3)$$

$$Y_i = \frac{\sum_{j \in A_i} W_{ij} Y_j}{\sum_{j \in A_i} W_{ij}} \quad (4)$$

where $A_i$ is the set of nodes adjacent to node i, $W_{ij}$ is the weight of edge (i,j), and $(X_i,Y_i)$ and $(X_j,Y_j)$ are the coordinates of the nodes at the ends of the edge (i,j). The iterations are performed by receiving an initial set of coordinates for the control and datapath cell locations and repetitively solving equations (3) and (4) for new values of $X_i$ and $Y_i$ (i=1,2,3, . . . n), inserting the new values of $X_i$ and $Y_i$ into the right side of equations (3) and (4) for each iteration. The iterations may be terminated, for example, when a selected minimum change in all the control cell locations calculated from the previous iteration is observed. The algorithm finds the global optimum of the criterion used if there are at least some fixed nodes because the iterations performed as described above are equivalent to solving a linear system of equations.

The time cost of this iterative procedure is proportional to $dn^2$, where d is the average node degree. For the algorithms described herein, the node degree is the minimum number of edges between a fixed node and the node farthest from all fixed nodes. For datapath structures having a large number of cells, the time cost may be unacceptable; however, a novel feature of the present invention may be used to reduce the time cost as follows.

In the iterative process of determining the optimum coordinates of the control cells described above, the order in which the node coordinates are calculated strongly affects the time cost. The time cost may be reduced by beginning the iterative process with nodes (N1) that are adjacent to fixed nodes or to nodes that have already been placed (N0). For datapath design, the fixed nodes and the nodes that have already been placed (N0) are usually cells and hardmac pins. The process is then continued with nodes (N2) that are adjacent to the nodes (N1), and so on, until the process is completed with the nodes (NK) adjacent to the (N[K−1]) nodes, which are located the farthest from the (N0) nodes.

FIG. 5 is a diagram of a graph 500 illustrating an example of numbering graph nodes according to a method of the present invention. Shown in FIG. 5 are N0 nodes 502, N1 nodes 504, N2 nodes 506, N3 node 508, and edges 510. The edges may be identified as mentioned above by the nodes at each end of the edge. For example, the edge 510 connected to nodes numbered 1 and 9 may be identified by the nodes at each end as (1,9). The N0 nodes 502 are numbered from 1 through 8. The N1 nodes 504 adjacent to the N0 nodes are numbered from 9 through 16. The N2 nodes 506 adjacent to the N1 nodes are numbered from 17 through 20. The N3 node 508, which is the farthest from the N0 nodes 502, is separated from the N0 nodes by at least three edges, thus the degree of the graph 500 is three.

The ordering of nodes performed by the method described above reduces the proportionality of the time cost function from $dn^2$ to $dn^{1.5}$, that is, the time cost function is reduced by a factor equal to the square root of the number of nodes.

Another novel feature of the present invention that may be used advantageously to reduce the time cost function is that of checking only the coordinate changes for the last node in the sequence (the node having the highest degree) to determine whether to stop the iterative process rather than checking every one of the coordinate changes. The coordinates of the last node are dependent on the coordinates of the other nodes, therefore if the coordinates of the last node did not change, then the coordinates of the other nodes are also unchanged.

Yet another novel feature of the present invention that may be used advantageously to reduce the time cost function is that of limiting the number of iterations to obtain less accurate coordinates. In experiments performed with graphs containing thousands of nodes, acceptable accuracy of node coordinates was obtained in a time equal to O(dn).

The denominators of equations (3) and (4) need only be calculated once for each node, further reducing the time cost function. Another way to reduce the time cost function is to ignore edges connecting two fixed nodes and partitioning the graph into several smaller graphs.

FIG. 6 is a diagram of a graph 600 illustrating an example of partitioning a graph containing at least one fixed node according to a method of the present invention. Shown in FIG. 6 are N0 nodes 602, N1 nodes 604, edges 610, and partitions 612 and 614.

The edges connecting the N0 nodes 602 form the boundaries of the partitions 612 and 614 that contain the N1 nodes 604. Each of the partitions 612 and 614 is a simpler graph for which the optimum node coordinates may be solved in parallel. The average node degree of graphs describing datapath structures has been found to be a constant that does not depend on the number of nodes. In summary, the improvements to the time cost function described above, namely: the ordering of the nodes by distance from the fixed nodes, calculating the denominators of the coordinate equations only once for each node, and partitioning the graph into simpler graphs along boundaries defined by the fixed nodes, may be combined to reduce the time cost function from $O(dn^2)$ to $O(n)$.

Referring back to FIG. 4, the pin coordinates within the cells 402 and 404 may be considered by the placement function without increasing the complexity of the time cost function as follows. For each cell i, the coordinates of each internal pin p with respect to the center of the cell i are given as $(X_i^p, Y_i^p)$. Also, the orientation of each of the cells, that is, the angle of the cell rotation with respect to the X-axis of each cell, is the same for datapath design. The internal pins may be represented in a weighted graph M. In this graph, several parallel edges with weights $W_{ij}^{ps}$ may exist between nodes i and j, where p and s are internal pins of the cells identified by the nodes i and j, respectively. The placement quality function F is then given by:

$$F = \sum_{i=1}^{n} \sum_{j=1}^{n} \sum_{p \in P_i} \sum_{s \in P_j} W_{ij}^{ps} [(X_i + X_i^p - X_j - X_j^s)^2 + (Y_i + Y_i^p - Y_j - Y_j^s)^2] \quad (5)$$

F may be differentiated with respect to $X_i$ and $Y_i$ (i=1, 2, 3, . . . ,n) and equated to zero to obtain the following expressions to iteratively calculate the ideal cell coordinates $(X_i,Y_i)$:

$$X_i = \frac{\sum_{j \in A_i} W_{ij} X_j - \sum_{p \in P_i} \sum_{s \in P_j} W_{ij}^{ps}(X_i^p - X_j^s)}{\sum_{j \in A_i} W_{ij}} \quad (6)$$

$$Y_i = \frac{\sum_{j \in A_i} W_{ij} Y_j - \sum_{p \in P_i} \sum_{s \in P_j} W_{ij}^{ps}(Y_i^p - Y_j^s)}{\sum_{j \in A_i} W_{ij}} \quad (7)$$

where $A_i$ is the set of nodes adjacent to node i, $P_i$ and $P_j$ are the sets of internal pins for nodes i and j, respectively, and $W_{ij}^{ps}$ is the net importance weight of edge (i, j) connecting internal pin p of node i and pin s of node j. The weight $W_{ij}$ may be calculated from:

$$W_{ij} = \sum_{p \in P_i} \sum_{s \in P_j} W_{ij}^{ps} \quad (8)$$

The iterations are performed by receiving an initial set of coordinates $X_i$ and $Y_i$ for the control and datapath cells and repetitively solving equations (6) and (7) for new values of $X_i$ and $Y_i$ (i=1,2,3, ... n), inserting the new values of $X_i$ and $Y_i$ into the right side of equations (6) and (7) for each iteration.

From formulas 6, 7, and 8, the time complexity for the iterative method described above is still seen to be proportional to n because all summations are performed on all edges of the graph 600.

FIGS. 7A and 7B are a flowchart 700 of a method of datapath cell placement summarizing the steps described above according to an embodiment of the present invention.

Step 702 is the entry point of the flowchart 700.

In step 704, a datapath description of datapath cells, control cells, and control cell connections is received as input.

In step 706, the control cells are numbered in a sequence (1, 2, 3, ... , n) according to distance between each control cell and at least one fixed control cell, where n is the number of control cells in the datapath description.

In step 707, an iteration counter and control cell coordinates $X_i$ and $Y_i$ for i=1,n are initialized.

In step 708, a criticality value $W_{ij}$ is determined for each cell connection between two numbered control cells i and j.

In step 710, the globally optimum coordinates $X_i$ and $Y_i$ for the each of the ordered control cells i is calculated from the datapath description according to a global maximum of a control cell placement function.

In step 712, the values of the coordinates $X_n$ and $Y_n$ calculated in step 710 are compared with the previous values. If the difference is less than a selected minimum difference, processing continues at step 718. Otherwise, processing continues at step 714.

In step 714, if the number of iterations exceeds a selected iteration limit, processing continues at step 718. Otherwise, processing continues at step 716.

In step 716, the values of the coordinates $X_n$ and $Y_n$ calculated in step 710 are substituted into the previous values, and processing continues from step 710.

In step 718, the values of the globally optimum coordinates $X_i$ and $Y_i$ for the each of the numbered control cells i are generated as output.

Step 720 is the exit point for the flowchart 700.

The method illustrated in the flowchart description above may be embodied in a computer program product and implemented by a computer according to well known programming techniques to perform the following functions: receiving as input a datapath description including an initial set of coordinates for a plurality of control cells; ordering the plurality of control cells in a sequence (1, 2, 3, ... , n) according to distance between each of the plurality of control cells and at least one fixed control cell in the plurality of control cells wherein n is the number of control cells in the datapath description; iteratively calculating globally optimum coordinates for the each of the plurality of control cells according to the sequence i=1, 2, 3, ... , n from a global maximum of a control cell placement function; and generating as output the calculated globally optimum coordinates for the each of the plurality of control cells.

The method of the present invention for global cell placement described above advantageously accommodates datapath designs having a large number of datapath and control cells, produces a globally optimum cell placement in terms of connectivity length and interconnection delays, includes internal cell pins, and has an almost linear time cost function.

The algorithm illustrated in the flowchart 700 finds the global optimum of the criterion used if there are at least some fixed hardmac pins. If some or all of the hardmac pins are non-fixed, then the method illustrated in the graph of FIG. 8 may be used to place hardmac pins and control cells.

FIG. 8 is a diagram of a graph 800 representative of a hardmac illustrating an example of a reduced set of available pin slots for placement of hardmac pins. Shown in FIG. 8 are available pin slots 802; nodes 804 represent fixed hardmac pins, nodes 806 represent non-fixed hardmac pins, edges 808 represent cell connections, and nodes 810 represent control cells. For simplicity, no datapath cells are included in this example.

The reduced set of available pin slots 802 is initially formed at an equal spacing along the hardmac boundary. A reduced pin set is used to decrease the run time of the placement algorithm. The number of pin slots 802 should be greater than or equal to the number of hardmac pins to be placed, but is usually much fewer than allowed by the technology used to implement the hardmac design. FIGS. 9, 10, 11, and 12 illustrate a method of optimum placement of hardmac pins and control cells for the hardmac represented by the graph 800 in FIG. 8.

FIG. 9 is a diagram of a graph 900 illustrating the addition of a node A connected to each of the non-fixed nodes 806 in FIG. 8. The fixed nodes 804 are placed in the closest available pin slots 802. The case where there are no fixed nodes 804 is described later. The time complexity of the step of placing the fixed nodes 804 in the available pin slots is O(1).

FIG. 10 is a diagram of a graph 1000 illustrating an optimum placement when node A is assigned to an available pin slot 802 in FIG. 8. The available pin slot 802 is selected such that the sum of the distances from the other available pin slots 802 assigned to hardmac pins is a maximum. In this example shown in FIG. 10, s8 is the available pin slot 802 for the node A. The optimum placement of control cells and hardmac pins is then calculated as described above. The time complexity of this step is proportional to n, because the placement algorithm is used for each of the available pin slots 802.

FIG. 11 is a diagram of a graph 1100 illustrating the placement of a non-fixed pin P closest to node A in FIG. 10. In this example, the closest non-fixed pin P is the non-fixed node 806 specified by the number 6. The non-fixed pin P is placed at the selected available pin slot 802, and the edge (A, P) is removed from the graph 1100. The time complexity of this step is also proportional to n, because the placement algorithm is repeated for all pin nodes.

The steps of placing node A in the available pin slot 802 farthest from the slots already containing pins and placing the nearest hardmac pin P in the available pin slot 802 containing node A is repeated by the number of non-fixed hardmac pins. As a result, all the non-fixed hardmac pins will be placed into available pin slots, and all the control cells will also be optimally placed. The time complexity of this process is O(mn), where m is the number of non-fixed hardmac pins, and n is the number of nodes, that is, the number of non-fixed control cells.

FIG. 12 is a diagram of a graph 1200 illustrating the placement of all the non-fixed hardmac pins and control cells after placement of the first hardmac pin P in FIG. 11.

In the case where none of the hardmac pins are fixed, then the hardmac pin represented by node 1 is placed in the available pin slot si, where j is the current iteration number of the placement algorithm before the step of placing node A. The other steps remain the same. The time complexity of this case is proportional to $m^2n$, because the placement algorithm is repeated m times.

FIG. 13 is a flowchart 1300 of the method described with reference to FIGS. 8–12 for a hardmac design where some or none of the hardmac pins are fixed according to an embodiment of the present invention.

Step 1302 is the entry point of the flowchart 1200.

In step 1304, a reduced set of available pin slots is created along the boundary of a graph representative of a hardmac in which the hardmac pins and control cells are the nodes of the graph, and the connections between the hardmac pins and the control cells are the edges of the graph.

In step 1306, if at least one hardmac pin is fixed, processing continues at step 1308. If none of the hardmac pins is fixed, processing continues at step 1310.

In step 1308 the fixed pins are placed in available pin slots and processing continues at step 1312.

In step 1310, a non-fixed hardmac pin is placed in an available slot corresponding to the iteration number of the placement algorithm. The placement algorithm may be that expressed by equations (3) and (4) or by equations (6) and (7) above. Alternatively, other placement algorithms may be used to suit specific applications.

In step 1312, an additional node A is created and connected to each of the non-placed hardmac pins.

In step 1314, node A is placed in an empty pin slot such that the sum of the distances to the pin slots in which pins have been placed is a maximum.

In step 1316, the non-fixed hardmac pin P in the optimum pin placement that is nearest to node A is placed in the same pin slot with node A and the edge between node A and pin P is removed.

In step 1318, if all hardmac pins and control cells have been placed, processing continues at step 1320. Otherwise, processing continues at step 1314.

Step 1320 is the exit point for the flowchart 1300.

The method illustrated in the flowchart description above may be embodied in a computer program product and implemented by a computer according to well known programming techniques to perform the following functions: (a) creating a reduced set of pin slots along the boundary of a graph representative of a hardmac wherein the hardmac pins are represented by nodes of the graph and the pin connections are represented by edges of the graph; (b) placing fixed nodes in available pin slots if there is at least one fixed node, otherwise placing one of the nodes in a pin slot corresponding to an iteration number of a placement algorithm; (c) adding a node A and connecting node A to each non-fixed node; (d) placing node A in an empty pin slot such that the sum of the distances to pin slots in which pins have been placed is a maximum; (e) placing a non-fixed hardmac pin P in an optimum pin placement that is nearest to node A in the same pin slot with node A and removing the edge between node A and pin P for each of the hardmac pins; (f) repeating steps (d) and (e) to place each of the hardmac pins and control cells.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The methods of the present invention for control cell placement described above advantageously accommodate datapath designs having a large number of datapath and control cells, produces a globally ideal control cell placement in terms of connectivity length and interconnection delays, includes internal cell pins, and has an almost linear time cost function.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of control cell placement comprising the steps of:

(a) receiving as input a datapath description including an initial set of coordinates for a plurality of control cells;

(b) ordering the plurality of control cells in a sequence according to distance between each of the plurality of control cells and at least one fixed control cell in the plurality of control cells wherein n is the number of control cells in the datapath description;

(c) iteratively calculating globally optimum coordinates for the each of the plurality of control cells in the sequence according to a global maximum of a control cell placement function; and (d) generating as output the calculated globally optimum coordinates $(X_i, Y_i)$ for the each of the plurality of control cells wherein the global maximum of the control cell placement function for calculating the globally optimum coordinates $(X_i, Y_i)$ for the each of the plurality of control cells is given substantially by the following equations:

$$X_i = \frac{\sum_{j \in A_i} W_{ij} X_j \sum_{p \in P_i} \sum_{s \in P_j} W_{ij}^{ps}(X_i^p \ X_j^s)}{\sum_{j \in A_i} W_{ij}}$$

$$Y_i = \frac{\sum_{j \in A_i} W_{ij} Y_j \sum_{p \in P_i} \sum_{s \in P_j} W_{ij}^{ps}(Y_i^p \ Y_j^s)}{\sum_{j \in A_i} W_{ij}}$$

wherein $A_i$ is the set of nodes adjacent to node i, $P_i$ and $P_j$ are the sets of internal pins for nodes i and j, respectively, and $W_{ij}^{pq}$ is a weight of edge (i, j) connecting internal pin p of node 1 and pin s of node j.

2. The method of claim 1 wherein the weight $W_{ij}$ is calculated substantially from the following equation:

$$W_{ij} = \sum_{p \in n_i} \sum_{s \in n_j} W_{ij}^{ps}.$$

3. A computer program product comprising:
a medium for embodying a computer program for input to a computer; and
a computer program embodied in the medium for causing the computer to perform at least one of the following functions:
 (a) receiving as input a datapath description including an initial set of coordinates for a plurality of control cells;
 (b) ordering the plurality of control cells in a sequence according to distance between each of the plurality of control cells and at least one fixed control cell in the plurality of control cells wherein n is the number of control cells in the datapath description;
 (c) iteratively calculating globally optimum coordinates for the each of the plurality of control cells in the sequence according to a global maximum of a control cell placement function; and
 (d) generating as output the calculated globally optimum coordinates for the each of the plurality of control cells
 wherein the global maximum of the control cell placement function for calculating the globally optimum coordinates $(X_i, Y_i)$ for the each of the plurality of control cells is given substantially by the following equations $$X_i = \frac{\sum_{j \in A_i} W_{ij} X_j \sum_{p \in P_i} \sum_{s \in P_j} W_{ij}^{ps}(X_i^p \ X_j^s)}{\sum_{j \in A_i} W_{ij}}$$

$$Y_i = \frac{\sum_{j \in A_i} W_{ij} Y_j \sum_{p \in P_i} \sum_{s \in P_j} W_{ij}^{ps}(Y_i^p \ Y_j^s)}{\sum_{j \in A_i} W_{ij}}$$

wherein $A_i$ is the set of nodes adjacent to node i, $P_i$ and $P_j$ are the sets of internal pins for nodes i and j, respectively, and $W_{ij}^{ps}$ is a weight of edge (i, j) connecting internal pin p of node i and pin s of node j.

4. The computer program product of claim 3 wherein the weight $W_{ij}$ is calculated substantially from the following equation:

$$W_{ij} = \sum_{p \in n_i} \sum_{s \in n_j} W_{ij}^{ps}.$$

5. A method of control cell placement comprising the steps of:
 (a) creating a reduced set of pin slots along the boundary of a graph representative of a hardmac wherein hardmac pins are represented by nodes of the graph and the pin connections are represented by edges of the graph;
 (b) placing fixed nodes in available pin slots if there is at least one fixed node, otherwise placing one of the nodes in a pin slot corresponding to an iteration number of a placement algorithm;
 (c) adding a node (A) and connecting the node (A) to each non-fixed node;
 (d) placing the node (A) in an empty pin slot such that the sum of the distances to pin slots in which pins have been placed is a maximum;
 (e) placing a non-fixed hardmac pin (P) in an optimum pin placement that is nearest to the node (A) in the same pin slot with the node (A) and removing the edge between the node (A) and the non-fixed hardmac pin (P) for each of the hardmac pins; and
 (f) repeating steps (d) and (e) to place each of the hardmac pins and control cells wherein the placement algorithm comprises the steps of:
  receiving as input a datapath description including an initial set of coordinates for a plurality of control cells;
  ordering the plurality of control cells in a sequence according to distance between each of the plurality of control cells and at least one fixed control cell in the plurality of control cells wherein n is the number of control cells in the datapath description;
  iteratively calculating globally optimum coordinates for the each of the plurality of control cells in the sequence according to a global maximum of a control cell placement function; and
  generating as output the calculated globally optimum coordinates $(X_i, Y_i)$ for the each of the plurality of control cells.

6. A computer program product comprising:
a medium for embodying a computer program for input to a computer; and
a computer program embodied in the medium for causing the computer to perform at least one of the following functions:
 (a) creating a reduced set of pin slots along the boundary of a graph representative of a hardmac wherein hardmac pins are represented by nodes of the graph and the pin connections are represented by edges of the graph;
 (b) placing fixed nodes in available pin slots if there is at least one fixed node, otherwise placing one of the nodes in a pin slot corresponding to an iteration number of a placement algorithm;
 (c) adding a node (A) and connecting the node (A) to each non-fixed node;
 (d) placing the node (A) in an empty pin slot such that the sum of the distances to pin slots in which pins have been placed is a maximum;
 (e) placing a non-fixed hardmac pin (P) in an optimum pin placement that is nearest to the node (A) in the same pin slot with the node (A) and removing the edge between the node (A) and the non-fixed hardmac pin (P) for each of the hardmac pins; and
 (f) repeating steps (d) and (e) to place each of the hardmac pins and control cells wherein the placement algorithm comprises the steps of:
  receiving as input a datapath description including an initial set of coordinates for a plurality of control cells;
  ordering the plurality of control cells in a sequence according to distance between each of the plurality of control cells and at least one fixed control cell in the plurality of control cells wherein n is the number of control cells in the datapath description;
  iteratively calculating globally optimum coordinates for the each of the plurality of control cells in the sequence according to a global maximum of a control cell placement function; and
  generating as output the calculated globally optimum coordinates $(X_i, Y_i)$ for the each of the plurality of control cells.

* * * * *